United States Patent
Zwart (10) Patent No.: US 9,875,197 B2
(45) Date of Patent: Jan. 23, 2018

(54) IDENTIFICATION OF MODULES ON A BUS

(71) Applicant: Cirrus Logic International Semiconductor Ltd., Edinburgh (GB)

(72) Inventor: Willem Zwart, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 9 days.

(21) Appl. No.: 15/063,902

(22) Filed: Mar. 8, 2016

(65) Prior Publication Data

US 2016/0267028 A1    Sep. 15, 2016

Related U.S. Application Data (60) Provisional application No. 62/130,254, filed on Mar. 9, 2015.

(51) Int. Cl.
  *G06F 13/22*  (2006.01)
  *G06F 13/42*  (2006.01)
  (Continued)

(52) U.S. Cl.
  CPC .......... *G06F 13/22* (2013.01); *G06F 11/1004* (2013.01); *G06F 13/1642* (2013.01);
  (Continued)

(58) Field of Classification Search
  CPC ...... G06F 13/22; G06F 13/42; G06F 13/1642; G06F 11/1004; G06F 13/4282; G06F 11/1076; H03M 13/09
  See application file for complete search history.

(56) References Cited

U.S. PATENT DOCUMENTS 6,118,789 A    9/2000 Wood, Jr.
7,096,257 B2 *  8/2006 Trisno ............... H04B 10/2513
                                                 709/220
(Continued)

FOREIGN PATENT DOCUMENTS

EP    0221303 A2   5/1987
WO    2009010745 A1   1/2009

OTHER PUBLICATIONS

International Search Report and Written Opinion, Application No. PCT/GB2016/050629, dated May 9, 2016, 12 pages.
(Continued)

*Primary Examiner* — Shelly A Chase
(74) *Attorney, Agent, or Firm* — Jackson Walker L.L.P.

(57) ABSTRACT

A method is provided for use in a host module, for identifying at least one accessory module on a bus, wherein the bus is configured to allow multiple accessory modules to be connected to the host module. The method includes sending a query to any accessory module connected to the bus, the query concerning whether the or each accessory module meets a specified criterion; and receiving synchronized responses from any accessory module that meets the specified criterion connected to the bus where said responses are specific to the query but non-specific to an effectively uniquely distinguishing feature of the individual module. It is then possible to determine from redundant information contained in an aggregate of the synchronized responses whether there is (a) no accessory module meeting the specified criterion, or (b) at least one accessory module meeting the specified criterion.

30 Claims, 5 Drawing Sheets

(51) Int. Cl.
     *H04L 12/403*    (2006.01)
     *G06F 11/10*     (2006.01)
     *G06F 13/16*     (2006.01)
     *H03M 13/09*    (2006.01)

(52) U.S. Cl.
     CPC ........ *G06F 13/4282* (2013.01); *H03M 13/09* (2013.01); *H04L 12/403* (2013.01)

(56) References Cited

U.S. PATENT DOCUMENTS

| | | | | |
|---|---|---|---|---|
| 7,555,016 | B2 * | 6/2009 | Page | H04L 7/0008 370/395.62 |
| 8,443,110 | B2 * | 5/2013 | Grinberg | G06F 13/42 370/256 |
| 2006/0277309 | A1 | 12/2006 | Eaton | |
| 2012/0221746 | A1 | 8/2012 | Grinberg | |

OTHER PUBLICATIONS

Combined Search and Examination Report under Sections 17 and 18(3), Application No. GB1508528.5, dated Nov. 27, 2015, 7 pages.
De Ford, Mark, "Intelligent I2C bus extensions", Research Disclosure, vol. 555, Jul. 2010, pp. 730-732.

* cited by examiner

IDENTIFICATION OF MODULES ON A BUS

FIELD OF DISCLOSURE

This relates to the identification of modules on a data bus, in particular when a master module can be used in connection with one or more slave modules. In particular, the identification can be performed when a host module can be used in connection with one or more accessory modules, which may be detachable.

BACKGROUND

In a situation in which multiple accessory modules are connected to a host module by means of a bus, it may be necessary for the host module to be able to address the accessory modules separately. The process of identifying the accessory modules, and allocating separate bus address spaces to them, is termed enumeration.

The enumeration process typically involves a series of broadcast queries from the host module to any accessory modules which may be present. Any module which satisfies a criterion in a query may respond. Depending on which modules are present, there may be a single module responding, no module responding, or multiple modules responding. Modules that are not responding will generally not affect the signal level on the medium. When no module responds to a particular query, the voltage level or logic level on the bus may thus be uncertain and the response ambiguous or uninterpretable. To avoid this issue in the case for example of a bus with signalling on a single wire, there may be active or passive circuitry provided so that, if no module responds, the logic level is a well-defined value.

Similarly, buses may include mechanisms which ensure that, when multiple modules provide a logic signal onto the bus, the resulting logic signal level can be resolved in a deterministic way.

Examples of such mechanisms include I²C and Sound-Wire™.

However, for various reasons, including EMI (electromagnetic interference) emissions or EMI susceptibility, it is preferable for a bus to comprise a pair of conductors or wires, over which the signal is transmitted as a differential signal, i.e. one wire carries a signal equal but opposite to that on the other one with respect to some defined common-mode voltage. However the advantageous properties of the differential transmission configuration transmission rely on the symmetry of the conductor arrangement, so it is undesirable to provide an asymmetrical pull-up.

There is also the problem of distinguishing between situations in which just one module responds and when multiple modules respond. If such replies are indistinguishable, the enumeration algorithm may be unduly inefficient.

SUMMARY

According to a first aspect of the present invention, there is provided a method, for use in a host module, of identifying at least one accessory module on a bus, wherein the bus is configured to allow multiple accessory modules to be connected to the host module, the method comprising:
  sending a query to any accessory module connected to the bus, the query concerning whether each accessory module meets a specified criterion;
  receiving synchronised responses from any accessory module that meets the specified criterion connected to the bus where said responses are specific to the query but non-specific to an effectively uniquely distinguishing feature of the individual module;
  determining from redundant information contained in an aggregate of the synchronised responses whether there is (a) no accessory module meeting the specified criterion, or (b) at least one accessory module meeting the specified criterion.

This has the advantage that both null and multiple responses may be distinguished from a single module response without degrading the symmetry of the differential transmission medium.

BRIEF DESCRIPTION OF THE DRAWINGS

Embodiments of the invention will now be described by way of example only with respect to the accompanying drawings, of which.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

DETAILED DESCRIPTION

Figure 1:
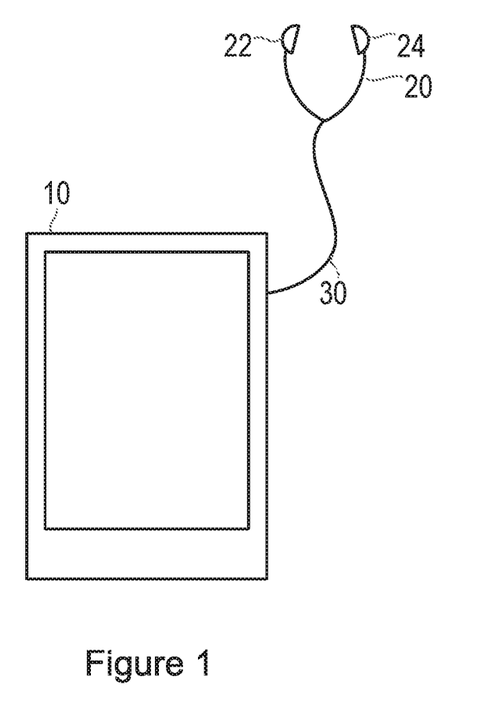
FIG. 1 illustrates an audio system.

FIG. 1 shows an audio system, as just one example of a system using the methods described herein.

Specifically, FIG. 1 shows a host device 10, which in this example is a smartphone, but which may be any device. The circuits and method described here may be used in situations where a host module is provided in, or takes the form, of a codec in a host device such as a portable audio device, but may also be used in other situations. In this example, the host module has audio processing capability.

FIG. 1 also shows an accessory product 20, which in this example takes the form of a pair of earphones, but which may be any device. In this example, the pair of earphones has two earpieces 22, 24, each of which includes a speaker for reproducing sound in response to audio signals transferred from the host module. Each of the earpieces 22, 24 also includes at least one microphone, for example for detecting ambient noise in the vicinity of the wearer.

Signals representing the ambient sound are then transferred from the earphones to the host device 10, which performs a noise cancellation function using an algorithm and generates anti-noise signals that it transfers to the earphones for playback. The effect of playing back the anti-noise signals is that the level of ambient noise heard by the wearer is reduced, and the wanted sounds (music, speech, or the like) that are also being transferred from the host device 10 are therefore more audible.

Thus, data is transmitted bidirectionally, from the host device to the accessory product, and from the accessory product to the host device. As noted above, there are multiple situations in which this requirement exists, and FIG. 1 shows just one example of such a system.

The accessory product 20 is connected to a host module in the device 10 by means of a cable 30. In one example, the cable 30 may be provided with a conventional 4-pole TRRS jack, while the device 10 is provided with a matching 4-pole socket. In other examples, the cable may be in any suitable format, for example it may be a USB Type-C connector, which similarly has four poles available for an audio interface. As a further alternative, the accessory product (or the host device) may be provided in a USB Stick dongle, with data being transferred between the dongle and the other device over a USB-compliant wired communications link. These are simply examples of transmission lines that can be used to carry bidirectional data between two devices.

In such a system, it is advantageous for the host module to be able to identify any accessory module that is connected to it, and the process of identifying the accessory modules, and allocating separate addresses to them, so that different data or command signals can be sent to the different accessory modules, is termed enumeration.

In addition, it should be noted that a single product can include multiple accessory modules. For example, in the case of an audio system as shown in FIG. 1, the earphones 20 may include a microphone and a speaker in each of the two earpieces 22, 24, and the microphones and the speakers may be regarded as four separate accessory modules for the purposes of enumeration, for example if it is intended that the host module should be able to transmit separate commands to them.

Other audio systems in which it may be necessary for a host processor to perform enumeration of multiple accessory modules include:

- audio devices (such as phones, tablet computers, or speakerphones, for example), with functions such as receive-side and/or transmit-side noise cancellation, in which beamforming is used to determine a direction from which an ambient noise is arriving, and which therefore include multiple microphones on one bus, and each microphone can include a separate accessory module;
- devices such as laptop computers, televisions or home cinema systems, where stereo or surround sound is provided by multiple speakers, and each speaker can include a separate accessory module;
- devices such as laptop or tablet computers, in which multiple transducers or sensors are provided at separate locations around the device, and each of these transducers or sensors can include a separate accessory module.

In order to be able to perform the process of enumeration, it is necessary for the host module to be able to send command signals to the accessory module or modules, and for the accessory module or modules to be able to send responses.

It is also advantageous to be able to perform the process of enumeration when first detecting that the accessory module is connected to the host module, which may be before the accessory module and the host module have been able to perform a full synchronisation procedure.

Figure 2:
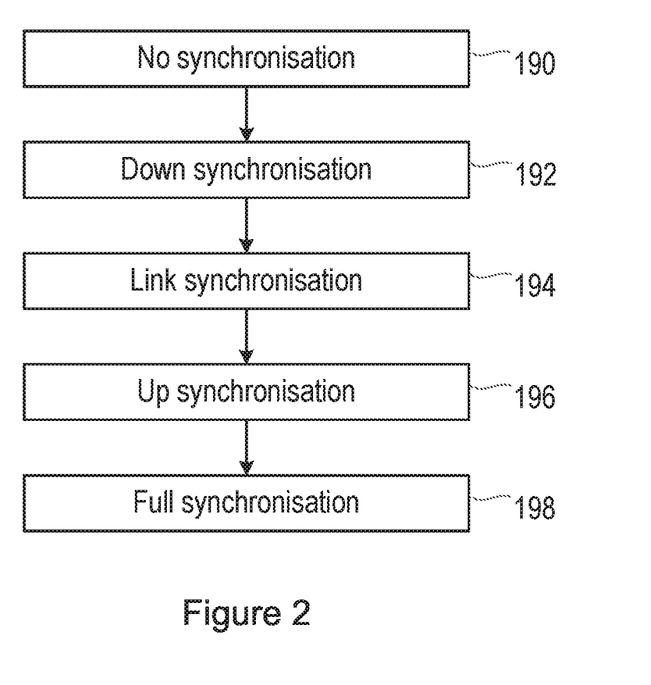
FIG. 2 shows a method of operation of a system.

FIG. 2 is a flow chart, illustrating a sequence of operations by which a host module may establish calibration and synchronisation with one or more accessory modules.

Specifically, FIG. 2 shows an initial step, which takes place on system start-up, power-up, or reset, or at a later time, when it is detected that an accessory jack has been inserted into the socket of the master device, or at a time when the system is already powered up with a jack inserted (or with accessory devices connected to the host in some other way) and an audio application is first started. At this stage, there is no synchronisation between the master module and the accessory module or modules. In step 190, the master module sends symbols that can be received by any slave module that is connected, allowing the slave to establish initial synchronisation.

In step 192, down synchronisation takes place, in which each slave sends symbols to the master module, allowing the master to recognise that all the slaves have established initial synchronisation and enter a synchronised state in which it may define further structure to any frame or superframe transmission data configuration employed.

In step 194, the slave or slaves may re-acquire frame lock according to any such revised frame or superframe data structure.

In step 196, the slave or slaves send synchronisation symbols to the master, which may then use the received synchronisation symbols to determine the timings of the individual received symbols relative to the timings of its own transmissions. The master module may then send timing delay control data based on that determination, in an iterative procedure until the timing reaches a desired value. The slave module or modules then stores a delay value based on that timing delay control data.

In step 198, the master and the slave module or modules reach full synchronisation and are ready to start transmitting actual payload data.

Figure 3:
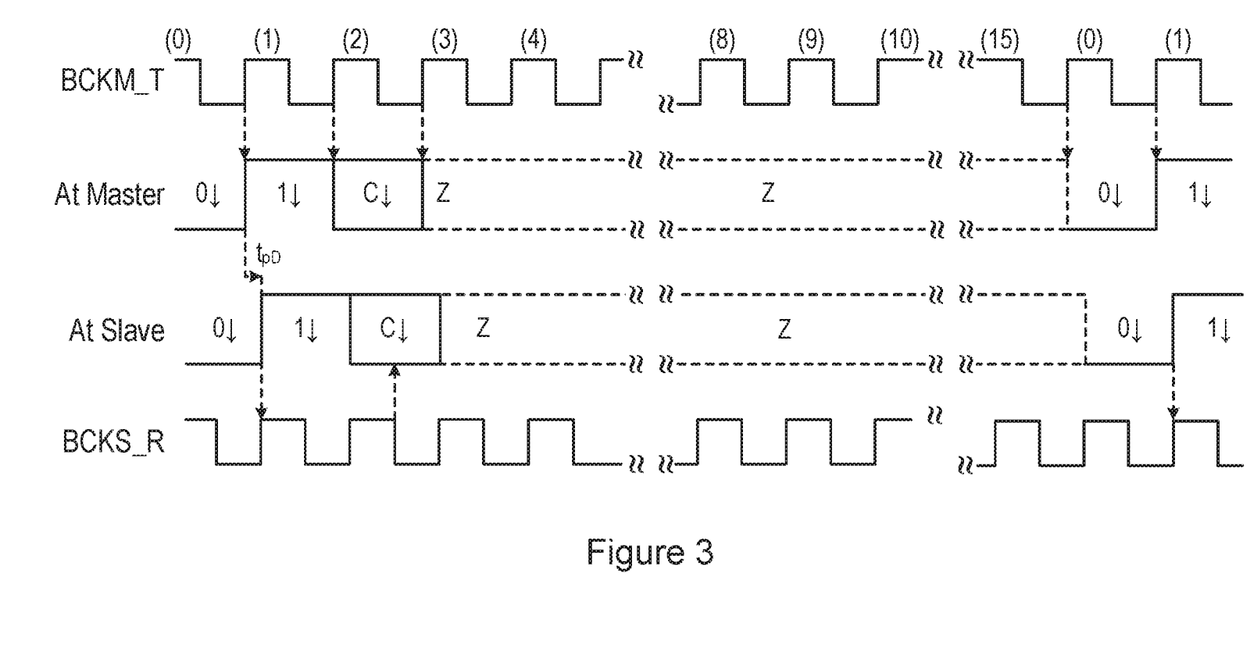
FIG. 3 is a time history showing signals transmitted in the method.

FIG. 3 is a timing diagram, showing in more detail the symbols sent by the master module for reception by any connected slave module in step 190 of the process shown in FIG. 2.

When it is powered up, the master module is generating a master transmission clock signal BCKM_T, which it uses for timing its transmissions. Specifically, at this time, the master module sends out a basic pattern that can be used by any connected slave module to establish timing information. Thus, the master module sends a synchronisation data pattern that consists of a 0 (shown as 0↓ in FIG. 3) and a 1 (shown as 1↓ in FIG. 3) in consecutive bit slots of each frame.

Time is divided into frames, with FIG. 3 showing the form of each frame, and a number of frames together are considered to be one superframe. In one example, there are 128 frames in one superframe.

In the first 16 frames of each repeating superframe of 128 frames, in the bit slot following the synchronisation data pattern, the master module sends a control bit (shown as C↓ in FIG. 3). In the period of each frame following the control bit, each module enters a high impedance state Z, during which there is no observable effect at that module of either module driving the wire. Depending on the physical configuration of the bus, the physical voltage levels may tend to stay at the previous logic level due to capacitance of the bus or may tend to drift to some common level, and may be more prone to influence by external interference sources.

As shown in FIG. 3, the symbols of the synchronisation data pattern transmitted by the master module are received by the slave module after a transmission delay of $t_{pD}$. The slave module contains circuitry for recovering a local slave reception clock BCKS_R based on the timing of the 0 to the 1 transition that occurs in each frame.

Once the slave reception clock BCKS_R has been established, a clock edge that is one and a half symbol periods later than the 0 to the 1 transition in the synchronisation data pattern is used to sample the control bits in the frames in which they occur. The presence of these control bits in the first 16 frames of each superframe, as described above, is then used by the slave module to identify the start of the superframe.

Once the slave module recognises this, it enters a down synchronisation state.

Figure 4:
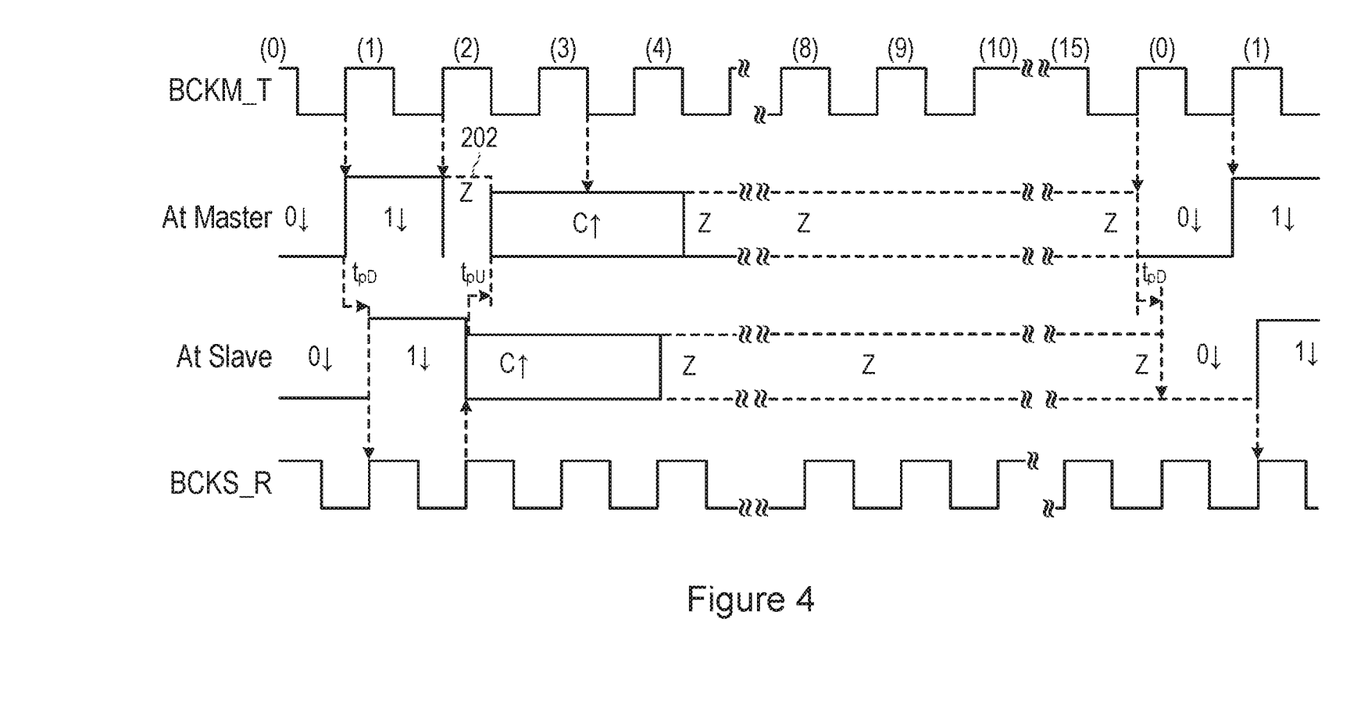
FIG. 4 is a time history showing further signals transmitted in the method.

FIG. 4 is a timing diagram, showing in more detail the symbols sent between the master module and the slave module in step 192 of the process shown in FIG. 2.

Specifically, in this example, the master module uses the first 16 frames of each superframe to send a control word to any slave modules that are connected to the bus, as described above with reference to FIG. 3. FIG. 4 then shows the situation in a part of the control frame that is outside the first 16 frames of the superframe.

During this period, the master module is continuing to send out the basic synchronisation data pattern consisting of a 0 (shown as 0↓ in FIG. 4) and a 1 (shown as 1↓ in FIG. 4) in consecutive bit slots of each frame.

As mentioned with reference to FIG. 3, the symbols of the synchronisation data pattern transmitted by the master module are received by the slave module after a transmission delay of $t_{pD}$.

Immediately after receiving the symbols of the synchronisation data pattern, the slave module sends a control symbol (shown as C↑ in FIG. 4), which is double the normal length, that is, it occupies two clock periods of the slave reception clock BCKS_R. This double length symbol allows the master module to sample the received symbol at a point that is well separated from a bit transition, even though the timing of the received signal will be unknown to the master module at that time.

The control symbols C↑ transmitted by the slave module over multiple frames form a control sequence.

FIG. 4 shows the double length symbol C↑ transmitted by the slave module to be received by the master module after a transmission delay of $t_{pU}$, so that there is a total gap, shown by the reference numeral 202, equal to $t_{pD}$ plus $t_{pU}$, between the time at which the master module completes sending the synchronisation data pattern and starts receiving the control symbols C↑ transmitted by the slave module. During the delay 202, the master module enters a high impedance state Z, during which there is no observable effect at the master module of either module driving the wire.

The control symbols transmitted by the slave module contain some information that confirms that the slave module is a valid slave, operating in accordance with the expected protocol.

On receipt of a valid control sequence, the master module enters the down synchronised state.

The master module is then able to start the process of enumeration, in order to identify the slave module or modules that are connected to the bus.

One issue that arises in performing the enumeration is that, before the enumeration is performed, the master module has no way of individually addressing the slave module or modules that are connected to the bus.

Moreover, it may not be possible for the master module to recognise separate responses from multiple slave modules. In this example, the bus encodes any single binary data bit into a single symbol, where a symbol is either one of two distinct signal levels for the duration of a single bit slot. The bus does not provide a logic resolution function, resolving the electrical state of the bus when two modules write simultaneously different data symbols on the bus, nor when no module is writing on the bus.

When two slave modules are driving the same symbol, the result on the bus is defined from a logic perspective. The currents from both modules will add up and result in extra amplitude at the receiving master module. However, when two modules write different data symbols onto the bus, the result will not be defined. Opposing currents from multiple slave modules will result in currents pushed by one slave module onto a single conductor, while being pulled from the same conductor in the opposite direction by a second slave module. As a consequence the resulting voltage on the bus at the various nodes will not be defined. Similarly, when no module writes a symbol onto the bus, the result on the receiving end of the link will not be defined.

In some embodiments the master when disabled may apply a Common Mode voltage level on the bus lines via respective termination resistances or the equivalent. Thus when no module puts data on the bus, as no module owns the specific bit slot, only the master will actively drive the bus by applying a Common Mode voltage level on the bus lines. As this signal level is nominally exactly in between the two signal levels characterizing the two distinct symbols, a detector will be unable to detect which symbol was written onto the bus.

In the illustrated embodiment, therefore, the master module sends a query that can be read by any accessory module connected to the bus, the query concerning whether each accessory module meets a specified criterion. The master module receives synchronised responses from any accessory module connected to the bus, and is able to determine from redundant information contained in an aggregate of the synchronised responses whether there is (a) no accessory module meeting the specified criterion, or (b) at least one accessory module meeting the specified criterion.

Figure 5:
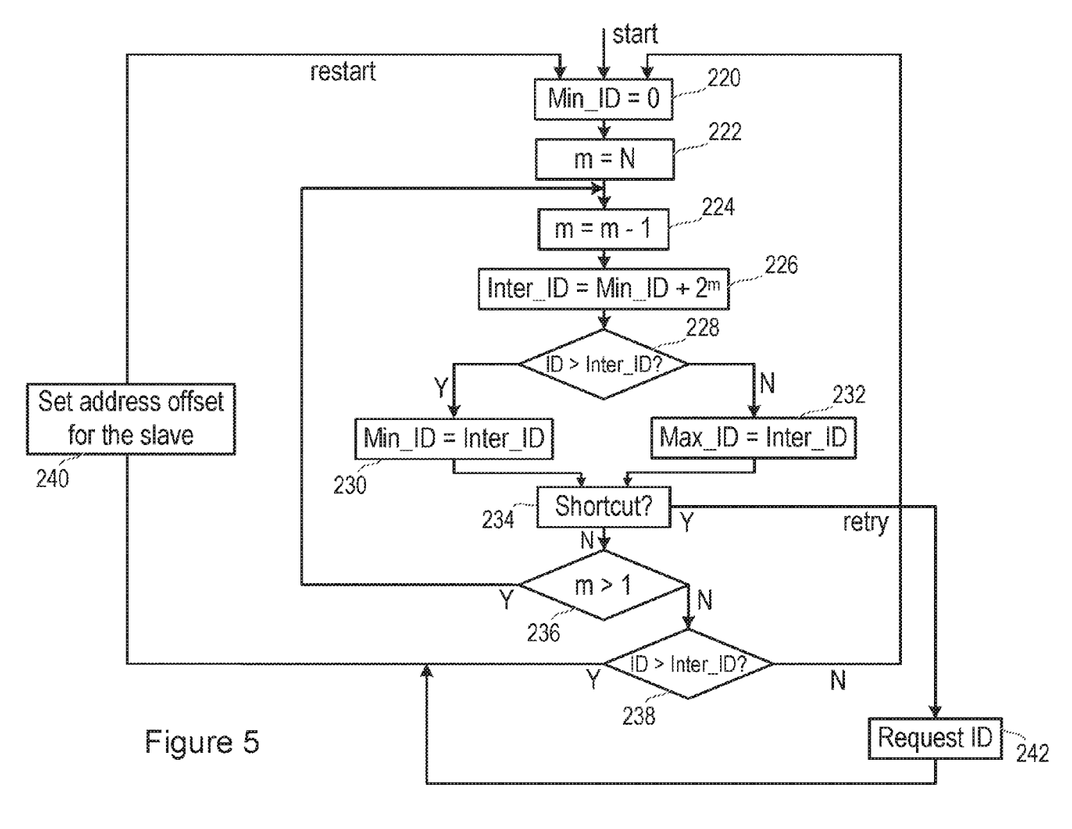
FIG. 5 is a flow chart, illustrating a part of the method in more detail.

FIG. 5 is a flow chart, illustrating an example of a process for enumerating the modules attached to the bus. This involves finding an effectively uniquely distinguishing feature such as a specific device ID of each such module. In this example, every module has a device ID that is 32 bits long, and is considered to be effectively unique. This device ID may be provided for example in part or in whole by hard wiring within an integrated circuit, by non-volatile memory within an integrated circuit or by pull-up or pull-up connections on pins or terminals of an integrated circuit.

The process operates on the basis that the master module can send queries on the bus during specified time periods, and can receive responses from modules during other specified periods. However, if two modules send different responses during those specified periods, the master module will be unable to distinguish the response.

Thus, in the process of FIG. 5, the master module sends out a series of queries that ask whether there is a connected slave module that meets a specified criterion. If one or more positive response to a query is received, the master module will be unable to tell whether one positive response or more than one positive response was received, and so it will send out a further query asking whether there is a connected slave module that meets a more restrictive criterion. The process reaches a positive outcome when the master module receives a positive response to a query that can only be answered positively by one slave module.

The process in FIG. 5 requires the master module to ask two types of question, namely whether any non-enumerated module on the bus has a device ID that is greater than a specified threshold value; or whether any non-enumerated module on the bus has a device ID that is equal to a specified value.

Other enumeration processes may require the master module to ask a third type of question, namely whether any non-enumerated module on the bus has a device ID that is less than a specified threshold value.

As discussed below, the modules may also support a further type of query on the bus, requesting any non-enumerated module having a device ID in a specified range to send a response containing its actual device ID.

In FIG. 5, the parameter Max_ID represents the device ID, above which there is known to be no unenumerated slave as a result of previous tests. This therefore takes an initial value of ($2^N-1$), where N is the number of bits in the device IDs (for example 32). The parameter Min_ID represents the device ID, above which there is known to be an unenumerated slave as a result of previous tests. This takes an initial value of zero, as shown in step 220 of the process, which starts when the master module recognises that there is at least one slave module performing the synchronisation process.

In step 222, a parameter value m is set to be equal to N.

In step 224, the value of the parameter m is reduced by 1. (Clearly, the order of steps can be altered, so that the parameter value m is initially set to be equal to (N−1)).

In step 226, the value of a parameter Inter_ID is set, to act as the ID threshold currently being tested, when asking the questions set out above. Specifically, the value of Inter_ID is set to be equal to the current value of Min_ID+$2^m$. This sets the mth bit of the ID to 1, the more significant bits having by now been determined and the less significant bits still being zero. In an alternative embodiment the value of Inter_ID may be set to be half way between the current values of Min_ID and Max_ID In step 228, the master module sends a query on the bus, asking whether any non-enumerated module on the bus has a device ID that is greater than the current value of Inter_D.

If the master module receives a reply from one or more slave module, indicating that the respective module does have a device ID that is greater than the current value of Inter_ID, the process passes to step 230, in which the current value of Inter_ID is set as the new value of Min_ID. If the master module receives no positive reply from any slave module, it is now known that there is no unenumerated module having a device ID that is greater than the current value of Inter_ID, and so the process passes to step 232, in which the current value of Inter_ID is set as the new value of Max_ID.

In some situations, discussed below, a shortcut step 234 is performed. However, otherwise, the process passes to step 236, in which it is determined whether m is greater than 1. If so, the process returns to step 224, in which the value of m is decremented by 1 and the following steps are repeated.

If it is determined in step 236 that m is not greater than 1, the process has completed, because the search has converged and there is then only one possible device ID, which is the current value of Inter_ID. Therefore, in step 238, to confirm this deduction, to guard against any error in the process, the master module sends a query on the bus, asking whether any non-enumerated module on the bus has a device ID that is equal to the current value of Inter_ID. A positive answer is expected, in which case the process passes to step 240, and the current value of Inter_ID is taken to be the ID of that module. A bus address can then be allocated to the slave module on that basis. For example, the bus address may have only 4 bits, compared to the 32 bits of the device ID.

If a negative response (i.e. no response) is received in step 238, there has been an error, and the process is repeated.

Thus, the process effectively performs a binary search, halving the search space in each iteration until the device ID is identified. However, as mentioned above, step 234 is a possible shortcut, which can be taken in order to reduce the length of the search algorithm. Given that the number of accessory modules (likely to be less than 10) is likely to be orders of magnitude smaller than the possible ID address space (e.g. 32-bit), after a few iterations there may statistically (or with some pre-knowledge of the distribution of device IDs) be a strong probability that there is only one module having a device ID within the part of the search space that has not been eliminated by previous queries. Thus the master may proceed directly to step 242, in which the master module sends a different query on the bus, requesting any non-enumerated module, having a device ID in the range from Min_ID to Max_ID, to send a response containing its actual device ID. This step may be initiated after a predetermined number of iterations.

The process can then pass as before to step 240, and the device ID returned by the slave module can be used to allocate an address. The response detected by the master module following the query sent in step 242 may be a response received from multiple slave modules, indicating that the master was incorrect in assuming that there was only one module having a device ID within the part of the search space that had not been eliminated by previous queries. In that case, the process of FIG. 5 can be resumed at an appropriate point (for example at the step 236), to narrow the search space further.

Thus, in this process, the master module sends at least one query to any accessory module connected to the bus, the query concerning whether each accessory module meets a specified criterion, in that its device ID is within a part of the possible range. The master receives synchronised responses from any accessory module connected to the bus, and determines from redundant information contained in an aggregate of the synchronised responses whether there is (a) no accessory module meeting the specified criterion, or (b) at least one accessory module meeting the specified criterion. Successive queries may relate to a more restrictive criterion. Having restricted the criterion to a certain amount, and being satisfied that there is at least one accessory module meeting the specified criterion, the master module can then send a further query to accessory modules connected to the bus, and requesting a reply from any accessory module meeting the specified criterion. Based on redundant information contained in an aggregate of the synchronised responses, the master module can determine whether there is (a) one accessory module meeting the specified criterion, or (b) more than one accessory module meeting the specified criterion.

As mentioned above, the master module is typically unable to determine, for example when it detects a binary 1 on the bus, whether that value was transmitted by one slave module, or by more than one slave module.

In order to reduce problems caused by this, the process, in this embodiment, involves the master module sending queries that have yes/no answers, such as the questions described above, such as whether any non-enumerated module on the bus has a device ID that is greater than a specified threshold value. Any slave module meeting that criterion sends a positive response, while any slave module not meeting that criterion does not respond. (Similarly, each already-enumerated slave module will remain silent and not inject any signal onto the bus.) Moreover, any slave module meeting that criterion sends the same positive response. Further, that positive response is such that the master module knows in advance what the positive response will be, and the positive response is such that it is unlikely to appear on the bus by chance (which is relevant because the state of the bus is effectively undefined when no slave module sends any signal, and so the master module would effectively detect a random signal in that circumstance).

In one embodiment, each non-enumerated slave module that meets the condition associated with the interrogation command replies with a Cyclic Redundancy Check (CRC) value calculated over the received interrogation command. This reply will be the same from each module and thus, if there is more than one module replying, the responses will superimpose on the bus. The master module can therefore only detect the aggregate of the synchronised responses from the replying modules, but this will be sufficient to determine that there was at least one positive response. The responses may be received by the master with some difference in timing, due for example to different transmission delays along the physical bus, but since the slave module is replying with a double-length symbol, and these delays may be designed to be less than a symbol period, the correct logic value will still be decoded.

The master module can determine that the value detected from the aggregate of the synchronised responses is indeed a valid CRC calculated over its command, and can therefore confirm that a positive reply was received from at least one slave module.

Moreover, the CRC value is of sufficient length (for example, 16 bits) that it provides sufficient redundant information, such that the master module can be confident that this response has not appeared by chance.

If there is no non-enumerated slave module that meets the condition associated with the interrogation command, no module will inject any signal onto the bus during that symbol slot in the respective frames. The bus is then in an undefined logic state. Depending on the detailed construction of the PHY and the termination of the bus, the voltage on the bus may settle to a mid-rail (if single-ended) or balanced condition (if differential bus), or may retain their last values due to capacitive charge storage, and may slowly drift from one voltage value to another.

For a master to determine whether an answer (read operation) from one (or more) module(s) on the network was intentional and not by chance due to a noise pattern on an undriven bus happening to be the correct expected sequence or was corrupted through collision, it will need to rely on redundant information in the response. For example, in the case given above, the redundant information is given in the CRC. If the CRC is correct the master can assume that the answer it received was intentional by at least one module. There is no ability for a master to determine whether the same answer was given by one or multiple modules. The additive nature of the DAI PHY will make that one and the same message coming from multiple modules, will not be distinguishable from a message that came from only one module. The robustness of the CRCs is such that one can assume that the probability of a CRC being received as correct, whereas the bit sequence was either corrupted or was not transmitted by any of the slave modules at all is sufficiently small.

In other examples, the response sent by the slave module(s) could be a predetermined sequence of bits, again provided that this is of sufficient length that it provides sufficient redundant information, such that the master module can be confident that this response has not appeared by chance.

As mentioned above, the process can also involve the master module sending a further query to accessory modules connected to the bus, for example asking the relevant modules to return their device IDs. In this case, if multiple modules response, they will send different responses. Again, the master module will only be able to detect the aggregate of the responses. In order for the master to be able to determine that it has received multiple responses, the response sent by each accessory module should contain redundant information. For example, the accessory module might return its 32 bit device ID, plus a 16 bit CRC calculated over the device ID.

In that case, if the master module receives only one response, it will be able to confirm that the CRC is valid, and so it will be confident that the detected device ID is valid.

However, if the master module receives multiple responses, the values that it detects on the bus will be some aggregate of the responses. Where the signals sent by the two slave modules have the same bit value in any one position, the master module can expect to receive the correct value. However, where the signals sent by the two slave modules have different bit values in any one position, the value detected by the master module will be uncertain. The effect is that the CRC that the master module detects will almost certainly not by the correct CRC value for the device ID value that the master module detects.

Thus, the master module can distinguish between the cases where there is (a) one accessory module responding, and (b) more than one accessory module responding.

Although the method has been described with reference to an example in which the responses are used by the host module for the purpose of enumerating accessories on a bus, it will be appreciated that the method is of more general applicability, in situations in which there may be multiple slave modules, and the master module is only able to detect an aggregate of the responses from the slave modules.

The skilled person will thus recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar module in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in a host module, especially in a portable and/or battery powered device such as a mobile telephone, an audio player, a video player, a PDA, a mobile computing platform such as a laptop computer or tablet and/or a games device for example. Embodiments of the invention may also be implemented wholly or partially in accessories attachable to a host device, for example in active speakers or headsets or the like.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope. Terms such as amplify or gain include possibly applying a scaling factor of less than unity to a signal.

The invention claimed is:

1. A method, for use in a host module, of identifying at least one accessory module of multiple accessory modules on a bus, the method comprising:
sending a query to any accessory module connected to the bus, the query concerning whether each accessory module meets a specified criterion;
receiving synchronised responses from any accessory module that meets the specified criterion connected to the bus where said responses are specific to the query but non-specific to an effectively uniquely distinguishing feature of an individual module of the multiple accessory modules; and
determining from redundant information contained in an aggregate of the synchronised responses whether there is (a) no accessory module meeting the specified criterion, or (b) at least one accessory module meeting the specified criterion.

2. A method as claimed in claim 1, comprising sending a plurality of said queries to any accessory module connected to the bus, the queries concerning whether each accessory module meets respective, successively more restrictive, criteria.

3. A method as claimed in claim 1, further comprising, having determined that there is at least one accessory module meeting the criterion specified in one query:
sending a further query to any accessory module meeting the criterion specified in said one query;
receiving synchronised further responses from any accessory module meeting the criterion specified in said one query, where said responses are specific to an effectively uniquely distinguishing feature of the individual module; and
determining from redundant information contained in an aggregate of the synchronised further responses whether there is (c) one accessory module meeting the specified criterion, or (d) more than one accessory module meeting the specified criterion.

4. A method as claimed in claim 1, wherein the redundant information comprises a Cyclic Redundancy Check (CRC) value.

5. A method as claimed in claim 4, wherein the CRC value is calculated over the query sent by the host module.

6. A method as claimed in claim 4, wherein the CRC value is calculated over a part of the response sent by the accessory module.

7. A method as claimed in claim 1, wherein said query, sent to any accessory module connected to the bus, concerns whether each accessory module has a device ID value within a specified range.

8. A method as claimed in claim 3, wherein said further query, sent to any accessory module meeting the criterion specified in said one query, requests each accessory module to return its device ID value.

9. A method as claimed in claim 7, comprising enumerating each accessory module based on said responses.

10. A method, for use in a host module, of identifying at least one accessory of multiple accessory modules on a bus, the method comprising:
sending a query to any accessory module connected to the bus, the query concerning whether each accessory module meets a specified criterion;
receiving synchronised responses from any accessory module connected to the bus that meets the specified criterion; and
determining from redundant information contained in an aggregate of the synchronised responses whether there is (a) no accessory module meeting the specified criterion, or (b) at least one accessory module meeting the specified criterion.

11. A method as claimed in claim 10, comprising sending a plurality of said queries to any accessory module connected to the bus, the queries concerning whether each accessory module meets respective, successively more restrictive, criteria.

12. A method as claimed in claim 10 further comprising, having determined that there is at least one accessory module meeting the criterion specified in one query:
sending a further query to any accessory module meeting the criterion specified in said one query;
receiving synchronised further responses from any accessory module meeting the criterion specified in said one query, where said responses are specific to an effectively uniquely distinguishing feature of the individual module; and
determining from redundant information contained in an aggregate of the synchronised further responses whether there is (c) one accessory module meeting the specified criterion, or (d) more than one accessory module meeting the specified criterion.

13. A method as claimed in claim 10, wherein the redundant information comprises a Cyclic Redundancy Check (CRC) value.

14. A method as claimed in claim 13, wherein the CRC value is calculated over the query sent by the host module.

15. A method as claimed in claim 13, wherein the CRC value is calculated over a part of the response sent by the accessory module.

16. A method as claimed in claim 10, wherein said query, sent to any accessory module connected to the bus, concerns whether each accessory module has a device ID value within a specified range.

17. A method as claimed in claim 12, wherein said further query, sent to any accessory module meeting the criterion specified in said one query, requests each accessory module to return its device ID value.

18. A method as claimed in claim 16, comprising enumerating each accessory module based on said responses.

19. A host module, for use in a system comprising at least one accessory module connected to the host module via a bus interfaced between the host module and the at least one accessory module, wherein host module is configured to identifying the at least one accessory by:

sending a query to any accessory module connected to the bus, the query concerning whether each accessory module meets a specified criterion;

receiving synchronised responses from any accessory module connected to the bus that meets the specified criterion; and determining from redundant information contained in an aggregate of the synchronised responses whether there is (a) no accessory module meeting the specified criterion, or (b) at least one accessory module meeting the specified criterion.

20. A host module as claimed in claim 19, configured for sending a plurality of said queries to any accessory module connected to the bus, the queries concerning whether each accessory module meets respective, successively more restrictive, criteria.

21. A host module as claimed in claim 19 further configured for, having determined that there is at least one accessory module meeting the criterion specified in one query:

sending a further query to any accessory module meeting the criterion specified in said one query;

receiving synchronised further responses from any accessory module meeting the criterion specified in said one query, where said responses are specific to an effectively uniquely distinguishing feature of the individual module; and determining from redundant information contained in an aggregate of the synchronised further responses whether there is (c) one accessory module meeting the specified criterion, or (d) more than one accessory module meeting the specified criterion.

22. A host module as claimed in claim 19, wherein the redundant information comprises a Cyclic Redundancy Check (CRC) value.

23. A host module as claimed in claim 22, wherein the CRC value is calculated over the query sent by the host module.

24. A host module as claimed in claim 22, wherein the CRC value is calculated over a part of the response sent by the accessory module.

25. A host module as claimed in claim 19, wherein said query, sent to any accessory module connected to the bus, concerns whether each accessory module has a device ID value within a specified range.

26. A host module as claimed in claim 21, wherein said further query, sent to any accessory module meeting the criterion specified in said one query, requests each accessory module to return its device ID value.

27. A host module as claimed in claim 25, configured for enumerating each accessory module based on said responses.

28. An audio device, comprising a host module as claimed in claim 19.

29. An audio system, comprising an audio device as claimed in claim 28, and further comprising an accessory device comprising at least one accessory module.

30. An audio system as claimed in claim 29, wherein the accessory device is detachable from the audio device.

* * * * *